United States Patent [19]

Engebretson

[11] 4,256,389
[45] Mar. 17, 1981

[54] METHOD AND SYSTEM OF CONTROLLING SOUND AND EFFECTS DEVICES BY A FILM STRIP

[75] Inventor: Mark E. Engebretson, Warner Springs, Calif.

[73] Assignee: Paramount Sound Systems Corporation, Glendale, Calif.

[21] Appl. No.: 108,180

[22] Filed: Dec. 31, 1979

Related U.S. Application Data

[63] Continuation of Ser. No. 946,117, Sep. 27, 1978, abandoned.

[51] Int. Cl.³ .............................................. G03B 31/00
[52] U.S. Cl. .......................................... 352/11; 352/5; 352/92; 352/20
[58] Field of Search ......................... 352/6, 7, 8, 9, 10, 352/11, 92, 20, 21, 27, 5, 133

[56] References Cited

U.S. PATENT DOCUMENTS

| 2,714,633 | 8/1955 | Fine . | |
|---|---|---|---|
| 3,845,572 | 11/1974 | McCanney . | |
| 3,932,032 | 1/1976 | Weinstein | 352/11 |
| 3,973,839 | 8/1976 | Stumpf et al. | 352/5 |
| 4,086,005 | 4/1978 | Honebrink et al. | 352/133 |

FOREIGN PATENT DOCUMENTS

| 1003759 | 1/1977 | Canada . |
| 309208 | 4/1929 | United Kingdom . |
| 433285 | 5/1934 | United Kingdom . |
| 342284 | of 1931 | United Kingdom . |

OTHER PUBLICATIONS

*Journal of the Society of Motion Picture Engineers* Aug. 1941, pp. 127-145, "Fantasound" by Garity, et al.
*JSMPE* Aug. 1941 pp. 147-153, "Vitasound" by Levinson et al.

*Primary Examiner*—Monroe H. Hayes
*Attorney, Agent, or Firm*—Meyer, Tilberry & Body

[57] ABSTRACT

A method and system of blending the effective audio sensation in a theater having a plurality of audio speakers driven by a single program signal recorded on a motion picture film strip as the film strip is being projected in the theater, which method and system includes the driving of each of the speakers in the theater with a common program signal through an amplifier having a gain controlled by an analog electrical signal whereby the level of the analog signal determines the volume of the program signal at each of the speakers and creating a digital gain control signal for each of the speakers in response to a control signal recorded periodically on the film strip at locations on the film strip determined by the desired volume of a given speaker at a given time which digital gain control signal is converted to an analog signal and is used for controlling the driving amplifiers of each of the speakers in the theater in which the film is being projected.

11 Claims, 18 Drawing Figures

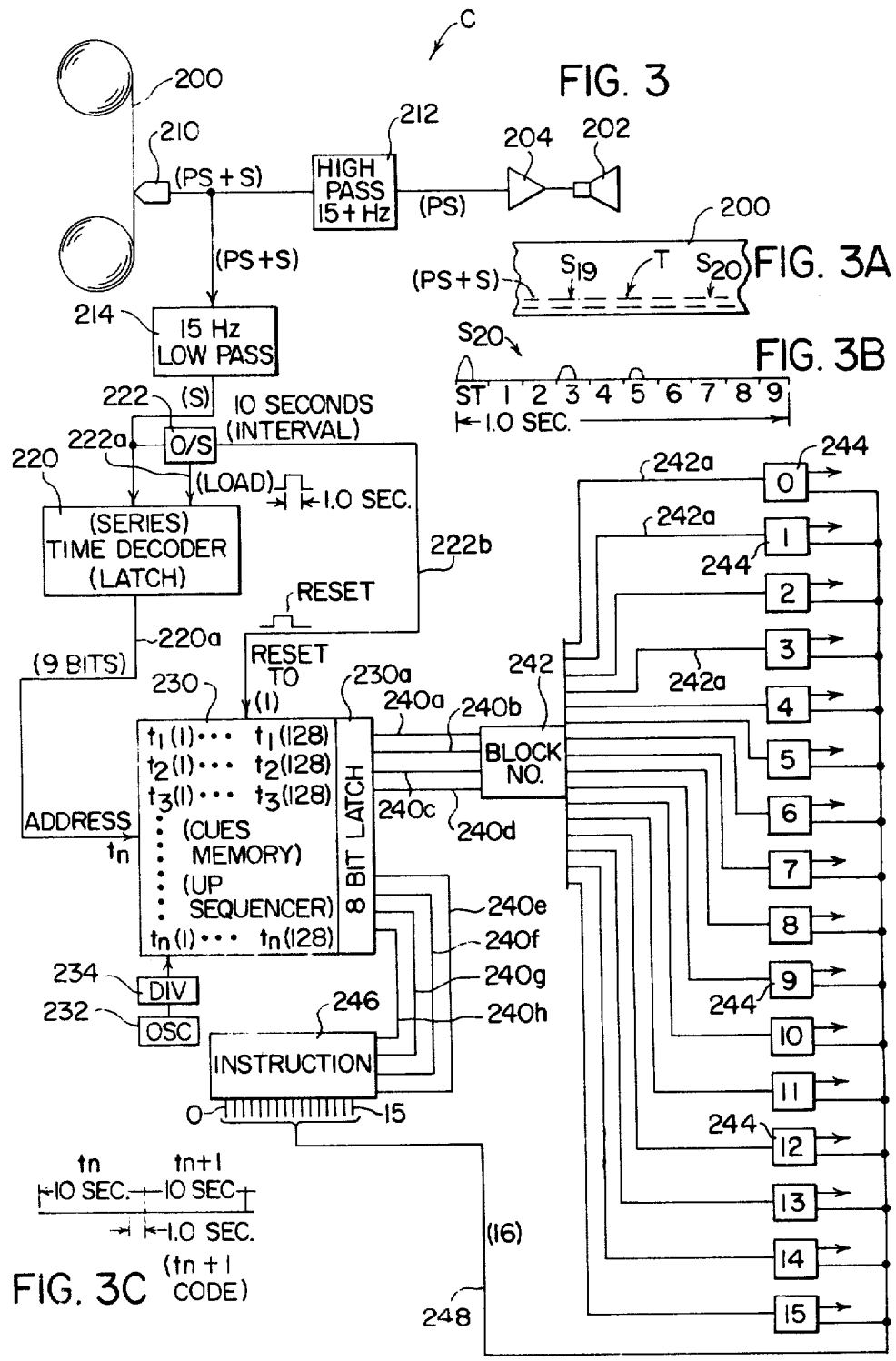

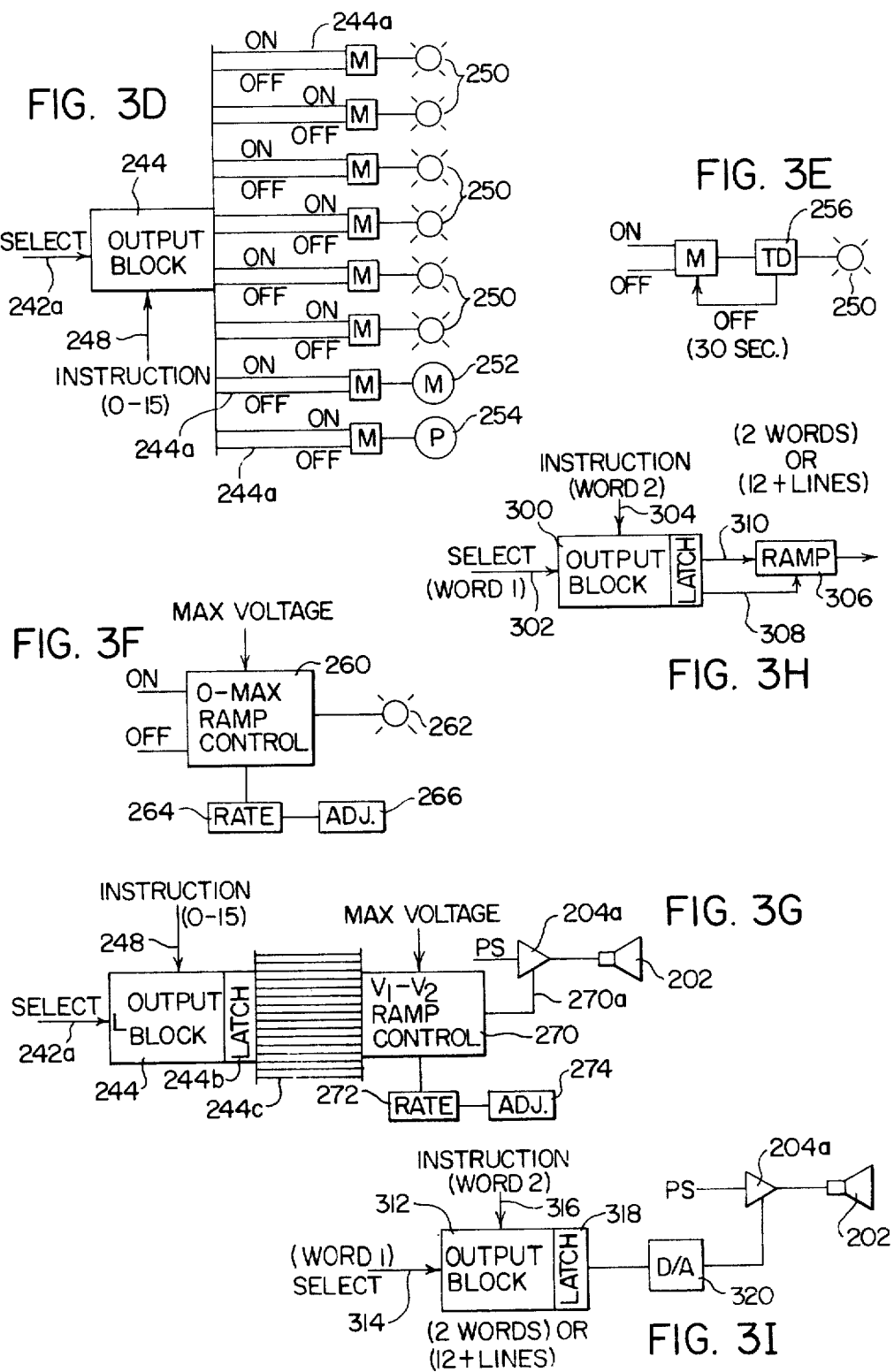

4,256,389

METHOD AND SYSTEM OF CONTROLLING SOUND AND EFFECTS DEVICES BY A FILM STRIP

This is a continuation of application Ser. No. 946,117 filed Sept. 27, 1978, now abandoned.

The present invention relates to the art of recording and displaying or projecting motion pictures and more particularly to an improved method and system for controlling the speakers and other special effects devices in a theater in accordance with the desired psychological effect to be created during the display of a motion picture on a screen.

The invention is particularly applicable for controlling speakers at various locations in a theater where a motion picture is being viewed and for controlling various special effects devices which are to be synchronized with the film strip being projected on a screen and it will be described with particular reference thereto; however, it is appreciated that the invention has much broader applications and may be used for controlling various devices in response to a signal contained on a moving recordable strip such as a film strip or sound recording strip.

BACKGROUND OF THE INVENTION

At one time the motion picture industry was active in the development and promotion of various systems for the production of three dimensional motion pictures, particularly of the stereoscopic type. Various systems were developed for obtaining a three dimensional effect in viewing the motion picture projected from a moving motion picture film strip. Many of these systems involved the visual aspects of the projected motion picture; however, the use of a three dimensional or positional effect by the use of spaced individually controlled speakers was not generally employed. To obtain blending of the sound from individually controlled speakers positioned at selected locations in a theater, a system was developed wherein selected speakers were individually controlled by signals on carriers of differing frequency recorded directly on the film strip. This concept is described in U.S. Letters Pat. No. 2,714,633. By using multiple carrier control signals recorded on a motion picture strip, it was possible to control individual speakers which were driven by the same program sound signal so as to create the effect of blending the sound by volume variations so that the sound would appear to come from various locations in the theater. This prior concept of providing separate signals on different carriers for controlling individual speakers in a theater had distinct disadvantages. For one, only a limited number of speakers could be controlled since the carrier frequencies were limited by the availability of recording space and band width on the film strip. Thus, the use of the system disclosed in the prior patent identified above was not too successful in obtaining accurate control over several speakers in a theater to give the wide variety of positional sound effects which are necessary to accommodate the desired blending of the sound in a motion picture environment. In view of the limitations of carrier space on the film strip itself and the limited number of speakers which could be controlled by the system of the prior patent, this system was not used to any great extent in the motion picture industry. In addition, this prior patent involves no vehicle for controlling special effects in a theater such as lights, motor driven devices, and special effects sounds which cannot be carried conveniently on the sound track of a motion picture film.

In an attempt to create a blending of the normal sound and infrasound another system is disclosed in U.S. Letters Pat. No. 3,973,839. In this patent, low frequency signals are recorded on the film strip of a motion picture. The logic analysis of the existence and nonexistence of these two signals is used to control the theater speakers and special effects speakers to give the infrasound. Again, the signals are recorded on the film and are used directly to control the special effects noise generator to obtain infrasound within a theater or sound arena.

In the two systems described above, there is no convenient manner for controlling the blending of the sound within a theater when several speakers are employed alone or in combination with a plurality of separate and distinct special effects devices such as switches, motor control devices, etc.

THE INVENTION

The present invention relates to a complete, integrated sound and special effects control system for use in a motion picture display theater or in a sound arena which does not require a substantial amount of space, band width or head room on the film being projected even through the sound blending and special effects control are synchronized with respect to the film. This concept is not shown in the prior art patents described above nor in any other system previously available to the motion picture industry. In summary, the present invention relates to a method and system wherein a number of independently located speakers can be controlled by a nominal signal on the film strip while maintaining synchronization with the film strip.

In accordance with one aspect of the invention, there is provided a method of blending the effective audio sensation in a sound arena having a plurality of audio speakers at selected locations and driven by a single program signal recorded on a sound recording strip as the strip is being played. This method comprises driving each of the speakers with the program signal recorded on the strip through an amplifier having a gain controlled by an analog electrical signal whereby the level of the analog signal determines the volume of the program signal at the speaker, creating a digital gain control signal for each of the speakers in response to a control signal recorded periodically on the strip, such digital gain control signal being determined by the desired volume of a given speaker at a given time, converting each of the digital control signals to an analog electrical signal corresponding to the desired volume at a given time and controlling each of the driving amplifiers for each speaker in accordance with the level of one of the converted analog signals.

In accordance with a more limited aspect of this invention, the digital gain control signal for each of the speakers is not recorded on the strip. In accordance with the modified arrangement, the digital control signal for each of the speakers is stored in a memory unit and is directed from the memory unit in response to a signal recorded on the strip.

In accordance with still another aspect of the present invention, there is provided a method of controlling a plurality of distinct devices in a theater displaying a projected motion picture contained on a moving film strip in synchronization with the film strip. This method comprises the steps of; providing on the film strip a series of synchronizing signals evenly spaced along the film strip, defining time intervals between the synchronizing signals when the film is moving at a selected rate, each of the synchronizing signals on the film including a time interval identification code, reading the synchronizing signals as they appear at or near the projected portion of the film strip to determine the current time interval of the moving film strip, selecting a group of preselected memory stored digital control signals in response to the determined current time interval identification code wherein the memory stored signals each include a selected code identifying one of a plurality of output blocks, each block controlling one or more of the aforementioned devices, and an instruction code identifying the control function at the output block performed on the device or devices, cycling the memory stored digital control signals of the selected group in a predetermined sequence over a period of time generally corresponding to the time interval and determined by the number of stored digital control signals in the selected group to direct the digital signals to the output blocks and causing the code selected output block of each digital control signal to perform the control functions of the instruction code of the digital signal.

In accordance with another aspect of the invention, there is provided an improvement in a motion picture film strip having a sound track upon which there is recorded a program signal for driving theater speaker amplifiers. This improvement includes a series of distinct signals recorded at spaced positions along the film strip wherein the distinct signals are decodable to produce a digital representation of the level of the gain for each of the speakers. In this manner, the motion picture film strip can be used to control the gain of each of the speakers in a theater individually according to the coded signal on the film strip. In addition, this coded signal can be employed together with an auxiliary device for controlling special effects devices located in the theater. In this manner, a total psychological sensation can be created in synchronization with the projected film strip in a theater.

In accordance with still another aspect of the present invention, there is provided an improvement in a system for controlling a plurality of distinct devices in a theater displaying a projected motion picture contained on a moving film strip in synchronization with the film strip. This improvement comprises a memory unit for storing groups of digital control signals for operating the distinct devices in a selected manner during a selected time interval, means readable from the moving film strip for actuating one of the groups of digital control signals for a selected current time interval readable from the moving film strip and means independent from the film strip for causing the stored digital control signals of the selected group to be outputted in a sequence corresponding to the time interval.

The primary object of the present invention is the provision of a method and system for blending sound from a single program signal of a motion picture film strip, which method and system allows independent control of sound speakers and does not require excessive recording space or frequency range on the film strip.

Another object of the present invention is the provision of a method and system as defined above, which method and system can individually control several speakers in a theater without requiring extensive frequency intelligence on the film strip itself.

Still a further object of the present invention is the provision of a method and system as defined above, which method and system uses recorded digital information or low frequency information on the film strip, each of which concepts requires a minimum of recording fidelity and frequency range. In accordance with this object, the actual intelligence for controlling the individual speakers is not recorded directly on the film as a modulated carrier. Each bit of digital information is recorded on a half cycle of a low frequency signal recorded on the film. In the latter instance, the low frequency signal has low intelligence and can be recorded directly on the program signal without distortion.

Yet a further object of the present invention is the provision of a method and system as defined above, which method and system can be expanded to control special effects devices without requiring additional space or recording capabilities on the film strip itself.

Another object of the present invention is the provision of a method and system as defined above, which method and system can obtain a high range of sound volume variations, i.e. in the neighborhood of 100 dB, without requiring a corresponding range on the film recorded signal.

A further object of the present invention is the provision of a method and system as defined above, which method and system is compatible with theaters not having special speakers or sound effects so that the film can be displayed in a normal fashion even though it is provided with additional information for especially equipped theaters.

Yet a further object of the present invention is the provision of a method and system as described above, which method and system employs a synchronizing signal which actuates a memory device that outputs the desired control signals for use in controlling both special effects devices and/or individual speakers in a theater.

These and other objects and advantages will become apparent from the following description taken together with the drawings and described below.

BRIEF DESCRIPTION OF DRAWINGS

FIG. 1A is a schematic drawing indicating the digital signal employed in the system illustrated in FIG. 1;

FIG. 1B is a schematic representation of the film strip upon which information is recorded by the method and system schematically illustrated in FIG. 1;

FIG. 1C is a schematic view illustrating a representative recording head and signal plan usable in the method and system schematically illustrated in FIG. 1;

FIG. 3 is a schematic logic diagram illustrating a modified concept of the present invention and employed in controlling both speakers and special effects devices in the projecting theater;

FIG. 3A is a schematic view illustrating a film strip employed in the system and method schematically illustrated in FIG. 3;

FIG. 3B is a pulse diagram illustrating the intelligence recorded on the film strip in accordance with the system and method illustrated in FIG. 3;

FIG. 3C is a time chart showing an operating characteristic of the method and system illustrated in FIG. 3.

FIGS. 3D-3G are schematic diagrams illustrating certain output concepts employed in the method and system illustrated in FIG. 3;

FIGS. 3H and 3I illustrate certain modified output concepts which could be employed in practicing the present invention;

PREFERRED EMBODIMENT

Figure 1:
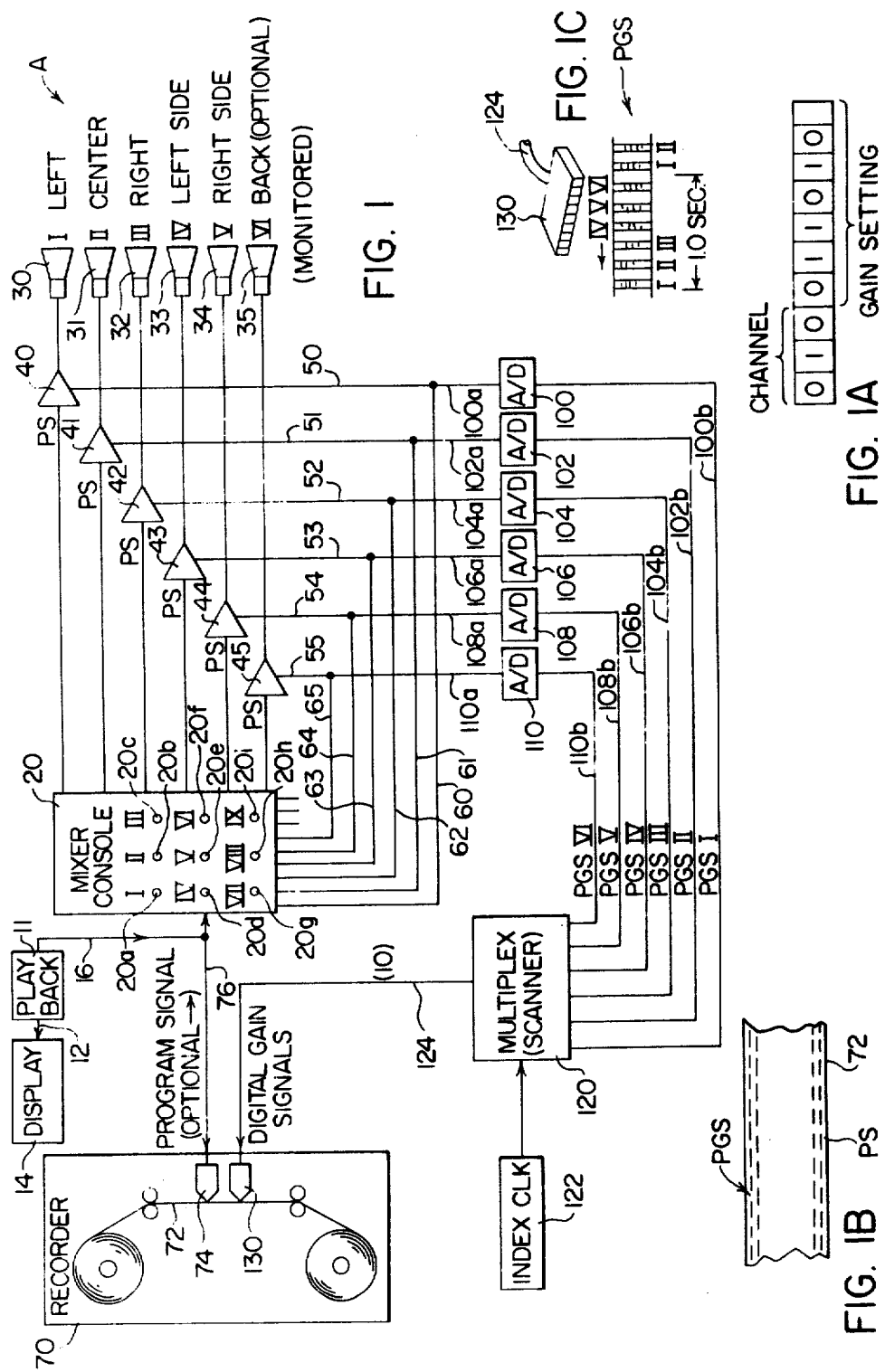
FIG. 1 is a schematic wiring diagram illustrating the recording concept employed in one aspect of the present invention.
Figure 2:
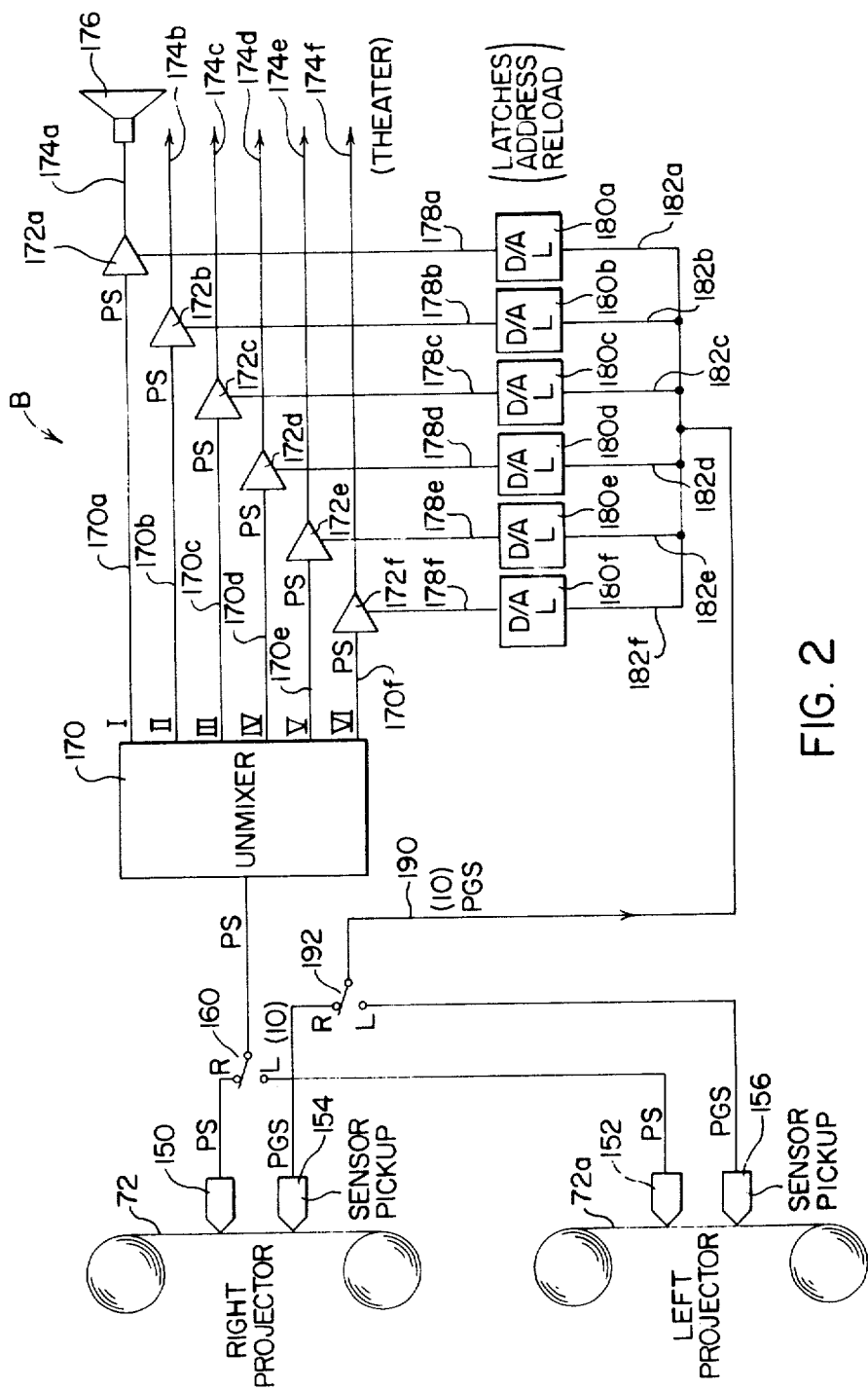
FIG. 2 is a schematic diagram illustrating the playback feature of the speaker employing the film strip produced in accordance with the schematic view shown in FIG. 1.

Referring now to FIGS. 1 and 2, one embodiment of the present invention is illustrated wherein individually located speakers in a sound arena, such as a motion picture theater, have varying volumes according to a sound blend determined to be appropriate for the particular motion picture or sound track being played. In the sound studio A indicated in FIG. 1, the sound track is applied to the motion picture film strip in accordance with somewhat standard recording practices. In accordance with the first embodiment of the invention, the sound track also includes a corresponding gain controlling signal recorded in the synchronized fashion with respect to the sound track and on the film strip for the purpose to be explained later. In accordance with the illustration, a standard playback unit 11 has a first output 12 for displaying the motion picture on an appropriate display unit or screen 14. Another output 16 of the playback unit 11 includes the program signal which has been recorded during filming of the motion picture or added at a later time. In accordance with the first aspect of the invention, the standard program signal recorded during the motion picture filming or other recording process is blended manually by a mixer console 20 having several individual channels controlled by manually controlled fader knobs 20a-i only six of which are used in the illustrated embodiment of the invention. These manually controlled fader knobs or pots are used to control the volume at several speakers 30-35 in a manner to be described. Each of the speakers in the sound studio is positioned in a preselected location generally labeled on FIG. 1. Essentially, the locations are separate and distinct channels which are to be blended to produce the desired sound sensation controlled by the audio engineer. To accomplish this, the speakers are provided with standard driving amplifiers 40-45 which receive standard program signal PS from mixer 20. This program signal is the general audio signal used on motion picture films to create sound in the theater as the film is being projected and displayed. Consequently, each amplifier 40-45 receives the standard program signal created during the filming or dubbing of the motion picture to be processed in accordance with the present invention. To obtain the desired blend, each amplifier 40-45 is a variable gain amplifier wherein the gain is controlled by an electric analog gain control signal on inputs 50-55. As the voltage level on these inputs changes, the gain of amplifiers 40-45 are adjusted accordingly. Consequently, a sound engineer can blend the sound projected from speakers 30-35 by controlling the voltage level on gain control inputs 50-55. The voltage on these inputs is controlled by each of the fader knobs 20a-i which create an analog signal in lines 60-65 in accordance with the manually adjusted position of knobs 20a-i. Thus, the desired sound effect at the various locations in the sound studio is obtained in synchronization with the displayed movie on the appropriate display device or screen 14. Each of the channels represented by speakers 30-35 are controlled manually by adjusting the analog signal in lines 60-65, respectively. A standard film strip recorder 70 processes film strip 72 by recording the standard program signal on line 76 by means of program signal recording head 74. Of course, this programming could be optical or magnetic according to the desired end result. A magnetic recording is illustrated for the purpose of showing the basic concepts of the first embodiment of the invention as used in the system illustrated in FIGS. 1 and 2. In some instances, film strip 72 can have the program signal recorded thereon prior to processing by recorder 70. In that instance, the recorder head 74 is a pick-up for directing a program signal through line 76 to mixer console 20. Also, the film can have the motion picture already developed thereon. In that instance, the display unit 14 would be the projection from recorder 70. Various arrangements for creating a standard program signal in synchronization with the motion picture on the film strip 72 can be envisioned without departing from the intended spirit and scope of the present invention which relates basically to the recording of a digital gain control signal on strip 72. This signal can be done simultaneously with the program signal as contemplated in the preferred embodiment of the invention shown in FIG. 1 or subsequent thereto. The latter instance would generally require a magnetic recording which is the preferred arrangement of the system illustrated in FIGS. 1 and 2. In accordance with the present invention, a plurality of separate analog to digital converting devices 100-110 are connected by input lines 100a-110a to the analog voltage input lines 60-65 emanating from console 20. Thus, the analog input to devices 100-110 are controlled by the blending gain of amplifiers 40-45 used to drive the positionally located speakers 30-35, respectively. The output of analog to digital converting devices 100-110 are lines 100b-110b each of which includes a ten bit binary word indicative of the channel location and gain setting of amplifiers 40-45. FIG. 1A illustrates a representative signal appearing in lines 100b-110b which would generally include ten separate output lines from devices 100-110, respectively. Each of these digital control signals is represented as a separate program gain signal labeled PGS I-VI at lines 100b-110b. Of course, analog to digital converting devices 100-110 could be a single multiplex unit which would repeatedly multiplex a three bit identification code and seven bit volume code or any combination thereof. The coding arrangement shown in FIG. 1A is representative in nature. The lines represented by outputs 100b-110b are connected to an appropriate scanning device shown as multiplex scanner 120 having an indexing clock 122. This indexer causes each of the input signals to be read in sequence and directed to output lines 124 of which ten are used in the illustrated embodiment of the invention. These lines are then directed to the input of a magnetic recording head 130 best shown in FIG. 1C. Consequently, as scanner 120 is sequenced, the digital signals in lines 100b-110b are sequentially directed to output 124 of scanner 120. Head 130 then records the digital signal along the film strip, in this instance this recording is by a magnetic strip on film 72. In this manner, the fader knob settings of mixer 120 are recorded on film strip 72 as it moves in recorder 70. In the illustrated embodiment, the standard program signal PS is also recorded in the separate magnetic track on film 72. Of course, optical recording is contemplated for use of the same type of system wherein the setting of the gain control in amplifiers 40–45 is recorded in a synchronized fashion with the program signal on filmstrip 72. In some instances, the gain of the separate amplifiers could be controlled automatically at various input locations when producing the program signal. For instance, the original recording of the program signal could be from several specifically positioned microphones at which volume is detected and used to control the gain of corresponding speakers in a theater. In this instance, the gain control of the various speaker amplifiers could be a recording of the volume of the originating sound at various locations during the original recording of the program signal. This program signal is still available for use by theaters which do not have special equipment to handle the gain control signal recorded on film strip 72 as illustrated in FIG. 2.

For illustrative purposes, FIG. 1A illustrates a digital signal which can be recorded for each channel represented by speakers 30–35. In the illustrated embodiment six channels are controlled by amplifier 40–45. At any given time the output of analog to digital converting devices 100–110 contain a certain number of bits which identifies the particular channel or system being monitored and a digital signal representing the level of the gain control voltage on one of lines 50–55. This digital signal is magnetically recorded on strip 72 as schematically shown in FIG. 1B. One track of the film is for the standard program signal PS and the other track is the program gain control signal identified as the PGS track. These tracks can be adjacent or spaced as illustrated in FIG. 1B. As shown in FIG. 1C, the separate ten bit gain control signals labeled I–VI are sequentially provided in a series of steps giving parallel loading or recording of the successive ten bit program control signals PGS I–VI as shown in FIG. 1. Of course, serial recording of these signals could be provided along the track of film strip 72. As shown in FIG. 1C, scanner 120 causes recording of all gain control signals in a preselected time span schematically illustrated as 1.0 seconds. Of course, the spacing between the several digital control signals could be decreased to provide more rapid updating of the digital information on strip 72 relating to the present or current analog signal controlling amplifiers 50–55.

As so far described, film 72 is provided with a recorded signal including digital information indicative of the present or current volume of speakers 30–35. Since the information recorded is digital, there is no need for a frequency carrier and no frequency distortion as would be required if separate and distinct frequency carriers were used to record modulated carrier information of the several gain signals on a single track or parallel tracks for subsequent control of the volume gain at speakers in a theater displaying film strip 72. As can be seen, only two tracks are required in practicing the present invention. One track contains the standard program signal which can be used in any type of theater. The other track includes gain control information in a succession of digital signals which are rapidly repeated to periodically monitor the current gain condition of amplifiers 40–45 in a synchronized fashion with respect to the picture being displayed from film strip 72. Although a single track is contemplated in the illustrated embodiment of the invention, it would be possible to provide six separate tracks of magnetic information along strip 72 for continuously updating the digital information available on the strip for controlling the speakers in a specially equipped theater.

Referring now to FIG. 2, film strip 72 and a second reel 72a are displayed in a theater B in accordance with standard practice. Each of these film strips has been processed in accordance with the description of FIG. 1 so that they include a program signal PS along one track which is a standard signal used in the audio or sound portion of the displayed motion picture. A second track includes the composite digital gain signals which are used in a specially equipped theater having several speakers positioned in locations or channels corresponding to the position or channels of speakers 30–35 of FIG. 1. Strip 72 is in the right projector while strip 72a is in the left projector. Pickups 150, 152 are used to play the program signals PS of the right projector or left projector, respectively. In a similar manner, pickups 154, 156 are sensors used to pick up the program gain signals recorded on a separate track either magnetically or optically for controlling the gain of various channels I–VI as previously identified. Changeover switch 160 is a standard switch which is for shifting from one projector to the other when there is a change in the reel being projected in the theater B. An unmixer 170 directs the program signal PS from sensor 150 or sensor 152 to the separate output channels represented by lines 170a–f. These lines form the input of variable amplifiers 172a–f which drive speaker lines 174a–f. These lines control speakers 176 only one of which is shown in FIG. 2. These speakers are positioned at distinct locations within the theater. If the theater is not equipped to modulate the gain of the amplifier used for the various speakers, the program signal 76 controls the level of the sound being created during the projection of film strips 72, 72a. A specially equipped theater has speakers 176 located in positions corresponding to the positions used in recording as shown in FIG. 1. In that instance, amplifiers 172a–f have a gain controlled by the analog voltage level in lines 178a–f. Thus, the volume of the various speakers located around theater B is controlled selectively by the analog voltage level in the control lines 178a–f. To control these voltages in accordance with the recorded program gain signals on film strips 72, 72a, there is provided in theater B a series of digital to analog converting circuits or devices 180a–f having an analog output connected to lines 178a–f and a digital input connected to input lines 182a–f. When a digital signal, in the preferred embodiment involving ten bits, is applied to all lines 182a–f, the latch feature of the converting device 180a–f corresponding to the channel identity code of the digital signal is released. This allows the digital signal to be inserted into the unlatched converting device. Thereafter, as a new identity code appears or there is no identity code, the activated converting device or circuit is latched. This holds the current digital signal representative of the current level in the converting device. The digital signal is applied to all devices 180a–f and the identity code unlatches only one of the devices. To apply the signal to the converting devices, there is provided input lines 190 which are ten lines in the representative embodiment of the invention. A ten pole switch 192 is used to connect the parallel digital signals from strip 72, or strip 72a according to the position of switch 192. This directs the digital signals in parallel form to the input lines connected to latched address converting circuits 180a–f. Thus, the volume of all speakers arranged in the theater is controlled in accordance with the digital program gain signal read by sensors or pick up devices 154, 156 from the recorded film. Consequently, the same blend obtained in the sound studio A of FIG. 1 is obtained in the theater B as shown in FIG. 2. Various arrangements and systems could be used for recording the digital information along a longitudinally extending track of the film strip to periodically adjust the gain of amplifiers 172a–f located in theater B. In the illustrated embodiment the amplifiers are changed in a relatively short time such as approximately one second. Of course, this time can be varied to provide essentially synchronized adjustment of the gain controls on the theater amplifier in accordance with the preprogrammed gain control signal. By adjusting the amplifiers, both the desired sound reproducing portion of the program signal and the noise inherent in recording sound are amplified. By changing the gain of the amplifiers, a high amplification can be obtained which is not obtainable on a recorded program signal of a motion picture film strip. Often the swing recordable without clipping on a film strip is in the neighborhood of 40–50 dB. By adjusting the gain, this amplification can be drastically increased to upwards of about 100 dB. Also, by using low gains on a relatively low volume program segment signals, the noise level is reduced. Thus, during recording of the program signal when a relatively low volume is to be produced in the theater a high signal-noise ratio can be used in the program signal. A low gain is then used to amplify this signal which reduces not only the volume of the program signal but also the corresponding level of the noise. This allows wide variation in the sound sensation in a theater without clipping the sound signal because of low head room on the sound track and without noticeable noise interference. In other words, by using the invention described in FIGS. 1 and 2, a large volume swing can be created at various locations in a theater without inhibition by the recording limitations on a motion picture film strip.

Referring now to FIG. 3 and FIGS. 3A–3I, there is illustrated a modified arrangement of a system for accomplishing the function of the system and method disclosed in FIGS. 1 and 2. In the first system, the film strip has a sound track upon which there is recorded a program signal for driving theater speaker amplifiers and a digital signal recorded along a separate track wherein the digital signal includes a series of digital sub-signals creating means for individually controlling the gain of the theater amplifiers. In the second system as shown in FIG. 3, the film strip has a sound track upon which there is recorded a program signal for driving the theater speaker amplifiers and a series of low frequency signals recorded at spaced intervals along the film strip wherein the low frequency signals are modulated to identify specific time intervals between consecutive low frequency signals. By using these time coded signals as will be explained later, special effects can be produced in a sequence between each synchronizing low frequency pulse which sequence is determined by a preprogrammed memory unit which is cycled in an area corresponding to the interval identified on the low frequency synchronizing pulse. In each instance, the motion picture film strip has a sound track upon which the program signal is recorded for driving theater speaker amplifiers and a series of distinct signals recorded at spaced positions along the film wherein the distinct signals are decodable to produce a digital representation of the level of the gain for each of the amplifier speakers located in a projecting theater. The system C shown in FIG. 3 is employed in the theater and includes an arrangement for projecting the picture from a standard motion picture film strip 200 having recorded thereon a standard program signal PS which program signal is preferably contained on a magnetic tape portion of the film strip. Of course, an optical program signal could be employed with the same functions to be hereinafter described. The program signal itself is used to drive theater speakers 202 through an appropriate amplifier 204. Only one speaker and amplifier is illustrated in FIG. 3; however, several can be employed in the theater. If the sound is to be blended as discussed with respect to FIGS. 1 and 2, several speakers are employed and the amplifiers 204 are provided with voltage gain control analog inputs which will become apparent from the description of the system shown in FIG. 3 which is usable for controlling the amplitude of the sound transmitted from several speakers located throughout the theater and for creating special effects such as moving curtains, creating smoke, driving motors, actuating lights, actuating auxiliary sound devices such as sirens, and other special effects for total psychological control of the theater during showing of the motion picture contained on film strip 200. The program signal itself is used in driving the speakers since it contains the sound intelligence for the motion picture screening. In accordance with the embodiment shown in FIG. 3, there is provided a synchronizing signal S at spaced locations along the sound track T as identified by $S_{19}$ and $S_{20}$ in FIG. 3A. Thus, at a preselected spacing along the film strip there is a synchronizing signal S which identifies the particular segment of the film to be processed during the next measured time interval. Since the spacing between synchronizing signals is constant and the film strip is projected at a fixed rate, the synchronizing signals occur repetitively at preselected time spacings during projection of the motion picture. In the preferred embodiment, the spacing is approximately 10 seconds so that a synchronizing signal occurs every ten seconds of the motion picture showing. In the preferred embodiment, the synchronizing signal is a low frequency signal having a carrier substantially below the audio range and preferably ten hertz. These synchronizing signals are each distinct and represent the particular segment of the film to be shown. A schematic representation of the single synchronizing pulse is shown in FIG. 3B wherein the half wave of a ten hertz signal is modulated to produce the starting pulse at the start of the signal and a pulse at various spaced locations along a single span which is represented to be 1.0 seconds. In the illustrated embodiment, the synchronizing signal is the twentieth time segment of the film which identifies a particular portion of film being shown. Of course, other arrangements could be provided wherein the synchronizing signal contains the modulated information indicative of the particular time interval or segment of the motion picture being projected. Since a ten hertz modulated frequency is quite low, it can be easily separated by a filter as schematically illustrated in FIG. 3. A pickup 210 picks up both the program signal and the synchronizing signal. The program signal passes through the high pass filter 212 which filters out the synchronizing signal S. In a like manner, the signal received by pickup 210 is passed through a low pass filter 214 which passes only the synchronizing signal. The synchronizing signal is then directed to a time interval decoder latch 220 which reads the synchronizing signal and provides nine bits of information along output line 220a. The digital information in lines 220a is representative of the particular time interval identified by a particular synchronizing signal. In the illustrated embodiment, a one shot device 222a allows decoder 220 to be loaded upon receipt of an initial pulse indicated as the starting pulse ST in FIG. 3B. Thereafter, the one shot device allows operation of the decoder latch 220 for 1.0 seconds by controlling the logic on line 222a. After one second, the latch is closed and the decoded time interval information on a particular synchronizing signal is latched into the output lines 220a of decoder 220. This provides an address identified as tn which is introduced into the addressing terminals of a cue card memory unit 230. As shown in FIG. 3C, the one second synchronizing signal occurs prior to a particular ten second time interval on the film. Each of the addresses tn is distinct to address a different location in the memory cue card 230. A second output 222b of one shot device 222 produces a reset pulse which resets the memory unit 230 to a starting position for a group of output signals represented as signals tn(1) to tn(128).

Referring now specifically to the function of the memory device 230, the device is provided with a standard latch output 230a which latches the digital information from the addressed and sequenced memory location to output lines 240a–h. To sequence the memory unit there is provided a sequencing arrangement schematically illustrated as a fixed frequency oscillator 232 and a frequency divider 234 so that the memory device is sequenced in a preselected time sequence through a fixed number of steps, (1) through (128) in the illustrated embodiment. This sequencing for a given address on line 220a requires the same time as the interval defined by the spacing between successive synchronizing signals. Thus, memory device 230 is sequenced through the predetermined number of steps in the time interval between successive synchronizing signals. Each of the steps in the interval creates a preselected eight bit digital word at the latched output 230a of memory device 230. For a time interval represented as ten seconds, an address appears in lines 220a which is indicative of the portion of the motion picture being processed or about to be processed. At the reset edge of pulse in output line 222b, memory device 230 recycles the first step of the addressed portion of the memory unit. For instance if the address is t20, memory device 230 would be reset by the pulse to process all digital information in the memory segment corresponding to the twentieth ten second time interval for the projected motion picture film. Thereafter, the synchronizing pulse has no effect and the memory unit 230 is freewheeling and sequenced by oscillator 232. At the first pulse from divider 234, an eight bit word stored at the first location in the addressed portion of the memory unit is latched into the output lines 240a–240h. Upon the next pulse, the next eight bit word stored in memory is latched into the output lines 240a–h. This continues for a preselected number of steps. The illustrated embodiment used 128 steps. Consequently, the synchronizing signal locates the group or block of digital words to be sequentially outputted from memory storage device 230 into output lines 240a–h. When the next synchronizing signal occurs, there is a large starting swing sufficient to again actuate the one shot device 122. This causes decoder 220 to again read the digital information in the synchronizing signal and store the address tn in output lines 220a. Thereafter, the new addressed portion of memory unit 230 is sequenced to output a series of several digital words which appear in sequence at the output of the memory device. Thus, each synchronizing pulse creates the next successive group of output digital words as sequenced by oscillator 232. These output words are used to update special effects devices during the time interval between successive synchronizing signals. This time interval in the illustrated embodiment is ten seconds so that an updating word appears at the output of memory device 230 at a rate of more than 10 per second. This is sufficient to control special effects devices such as lights, motors, pumps, etc. Also, these digital words can be used to change the gain on the amplifiers 204 to change the amplification at the various speakers located at different positions within the theater. It is possible to provide two auxiliary tracks one of which contains the information as indicated in FIGS. 1 and 2 and the other of which contains the synchronizing signals used in FIG. 3. In this manner, the synchronizing signals could control the special effects devices whereas the digital information on the film strip itself could be used to control the gain of the positioned speakers. If the theater is not provided with the necessary special effects devices or the specially located speakers, film strip 200 still could be processed in the standard manner.

A succession of digital words are latched into lines 240a–h in accordance with the address on lines 220a. These words are preprogrammed into the memory unit 230 to control the special effects devices connected to output blocks 244 shown at the right of FIG. 3. This succession of digital words controls each of the output blocks and contains, in the illustrated embodiment, four bits of block address information in lines 240a–d and four bits of instruction information in lines 240e–h. According to the digital coding on lines 240a–d, a particular word addresses one of sixteen output blocks 244 by enabling one of the select lines 242a. Thus, the block identification code latched into the output 230a of memory device 230 selects one of the sixteen output blocks 244. Instruction information on lines 240e–h energizes one of the output lines 248 of instruction decoder 246. These lines are directed to each output block 244 to instruct the block on the function being requested by the word latched in the output of memory device 230. Thus, during a preselected time interval between synchronizing signals, several words are directed to the output of the memory unit which controls the function of equipment connected to output blocks 244. In this manner, the special effects devices can be controlled continuously in accordance with a preselected pattern for a given time segment or interval in a motion picture being projected. The memory unit 230 thus is preprogrammed in accordance with the desired effects for a specific film. This memory unit which is preprogrammed is distributed with the film and is inserted into the circuitry of any theater provided with the special effects corresponding with the desired preprogrammed special effects in memory unit 230. Generally, the latch output circuit 230a, oscillator 232, oscillator 234, line 220a and line 220b remain in the theater. Only the preprogrammed memory device 230 for a particular program is distributed with the film itself for theaters having the special effects system. Film strip 200 is also useful in standard theaters not provided with circuitry for processing the synchronizing signals as schematically illustrated in FIG. 3.

Referring now to FIG. 3D, the special effects devices controlled by a single block 244 are schematically illustrated for the purpose of showing the function of each individual output block 244 selected by a signal in a given output line 242a of block decoder 242. In this illustration, several lights 250 are individually switched between an ON state and an OFF state by the instruction received in lines 248 by a selected block 244. During a single word at the output 230a of memory unit 230 one of the blocks 244 is selected. At the same time, one of the lines 248 is actuated. If one line in the group of lines 248 is actuated, one of the lights 240 is turned on through a memory device M which holds the condition directed from block 244. Another instruction during selection of the block shown in FIG. 3D will turn off the selected light. Also, other special devices can be turned on and off such as a motor 252 and a pump 254. Thus, the output block shown in FIG. 3D controls eight switching functions for eight separate special effects devices. Since there are sixteen output blocks 244 many special devices can be controlled. In practice, only a few of the blocks 244 are used in a theater. The other blocks may be inactive and are not addressed by any coded word sequenced from memory device 230. In FIG. 3E the safety device for lights and other two state devices are illustrated. In this particular instance, if the memory M turns light 250 on, after a preselected time delay 256, the light is automatically turned off by shifting memory M to the OFF condition. In this manner, a light will not remain on unless receiving an instruction to turn on before the time delay of unit 256 expires. This provides an override for the off signal to a special effects device if this is needed in a particular instance. This arrangement is optional for special effects devices. Referring now to FIG. 3F, a ramp control device 260 controls the intensity of a light 262 in accordance with the rate determined by a standard rate control device 264 adjustable by schematically illustrated unit 266. Thus, when light 262 is turned on by a signal in the ON line, light 262 increases in intensity at a rate determined by device 264. Other devices such as motors could also be used with a fixed rate ramp control device as schematically illustrated in FIG. 3F. As shown in FIG. 3G, a different type of ramp control is illustrated. In this instance, the ramp control 270 is a standard unit having a ramp control rate 272 adjustable by a device 274. The input to the ramp control is digital and is contained at the output of a latching circuit 244b by applying a signal in one of the output lines 244c. In this manner, the output 270a is a gradually changed analog signal having a control generally proportionate to the particular output line 244c which is energized by the code received on lines 248 from instruction decoder 246 as shown in FIG. 3. In this manner, a ramp controlled analog signal appears in output 270a. This ramp control analog signal could be used for adjusting the amplitude of a variable gain amplifier 204a driven by the program signal PS for changing the volume of the speaker 202. Thus, by a word at the output of memory unit 230 the volume of several speakers throughout the theater could be changed periodically. This change would be in accordance with the timing programmed into cue card memory unit 230. In this manner, the memory unit could also be used for adjusting the volume of the various speakers throughout the theater. Since a word is outputted in less than 0.1 seconds in the preferred embodiment, over ten amplifiers or special effects devices could be updated each second. This is sufficient capacity for controlling several speakers intermittently to provide the desire psychological sound and visual effect during projection of film 220. The illustrations in FIGS. 3E-3G are representative in nature of how other outputs could be controlled by the output blocks 244. Essentially, the synchronizing pulse creates a series of digital signals or words which updates several preselected devices within a theater to effect the sound and visual sensation of the film during a preselected time interval or sequence which is, in the preferred embodiment, approximately 10.0 seconds.

Referring now to FIGS. 3H and 3I, it is possible to provide two words at the output of memory device 230 with the first word providing a block selection and the second word providing the instructions. In this manner, more intelligence would be employed in directing the output function of the device. In addition, it would be possible to obtain an expanded intelligence for the instruction if more than eight bits were used in the output word of memory device 230. Thus, the illustrated circuits in FIGS. 3H and 3I are useful in an arrangement wherein two successive words are used to control an individual block and its instruction or an expanded number of lines are used at the output of memory device 230. In the illustrated embodiment twelve lines are used as a representative number of additional lines. In FIG. 3H, output block 300 is selected by a first word which selects line 302 through a decoder such as decoder 242 shown in FIG. 3. Instruction word in lines 304 could contain eight bits of information which are binary coded with some of the bits determining the reference voltage for the ramp device 306 through lines 310. The ramp rate can be controlled by lines 308 also obtained from the second word. By using two words, the second word could be used to provide the instruction without going through a one of sixteen decoder; therefore, additional intelligence could be received by the ramp device 306. This disclosure is only to show the versatility which could be introduced by using successive words to obtain both a select signal and then instruction signal. The same concept could be employed in the manner shown in FIG. 3I wherein the output block 312 is selected by a decoder first word providing a signal in line 314 and a second word containing eight bits is directed into block 312 by lines 316. This information is then latched into the output latch 318 of output block 312 to provide the digital data information at the input of the digital to analog converter 320 for controlling a variable gain amplifier 204a as previously described. FIGS. 3H and 3I are presented for illustrating the concept that various arrangements could be used for directing different digital information from memory device 230 for controlling special effects devices and amplifiers in the theater directing the motion picture contained on film strip 200.

Figure 4:
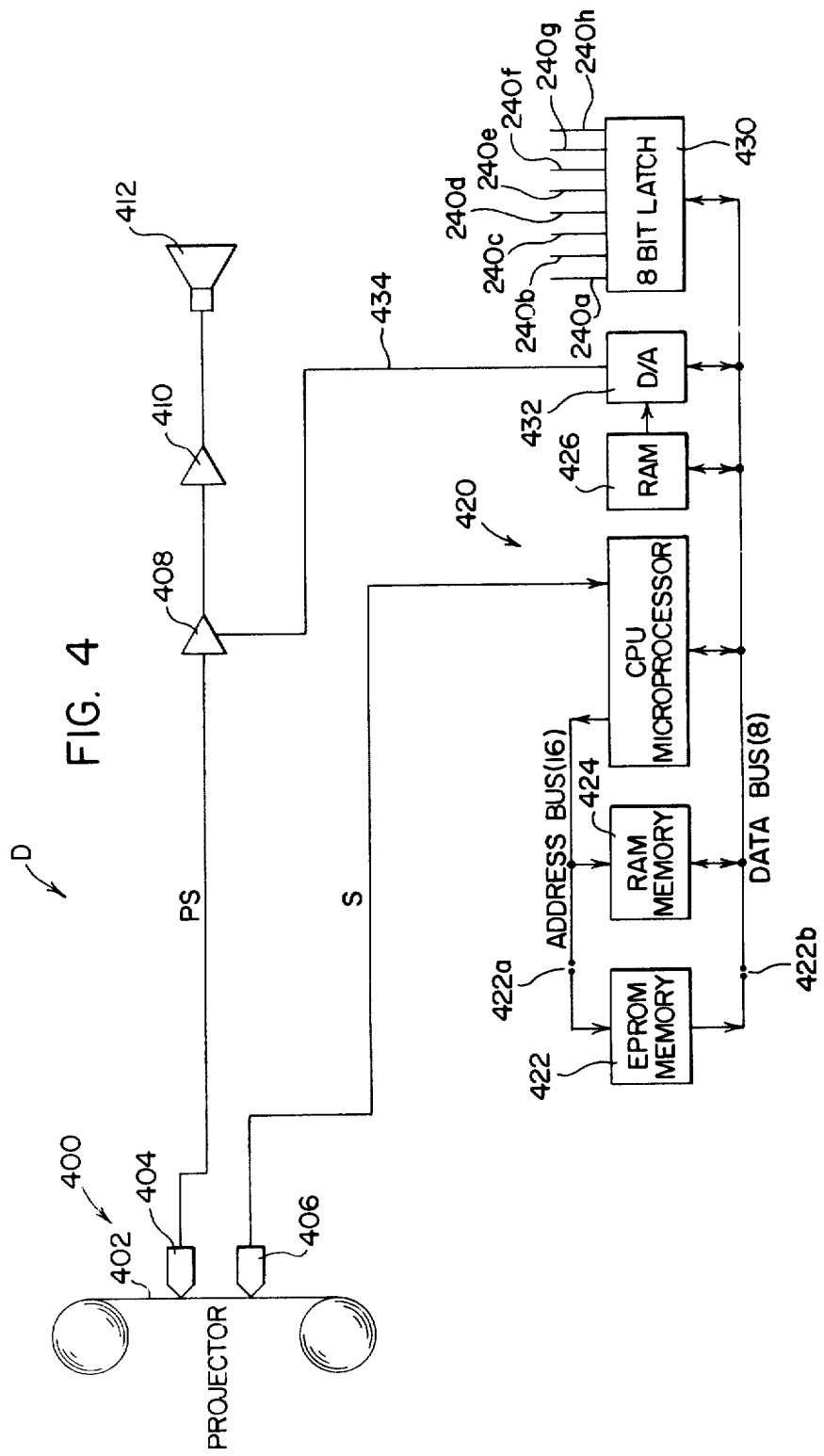
FIG. 4 is a schematic block diagram illustrating the use of the present invention with a microprocessor; and, FIGS. 5 and 6 are more detailed schematic block diagrams and wiring charts for practicing the concept of the invention with the microprocessor as schematically illustrated in FIG. 4.

Although the synchronizing signal is preferably a modulated ten hertz signal which carries the intelligence indicative of the interval for which a series of instructions are to be created, it is possible to use a digital signal for the identification of the timing intervals. Also, the synchronizing signal may be on a separate track from the program signal PS, as shown in FIG. 4. The illustration in FIG. 4 shows that the method and system illustrated in FIG. 3 can include a programmable controller for forming the various functions set forth in the description of the method and systems of FIG. 3. In the system D a projector 400 projects film strip 402 which includes two separate magnetic tracks one of which contains the program signal PS and the other of which includes the synchronizing signal S. The synchronizing signal may be a digital signal or a modulated ten hertz signal. The standard microprocessor controller circuit 420 receives the synchronizing signal periodically and performs all the functions set forth in FIG. 3 to the extent of controlling a series of digital words in output lines 240a-h corresponding with these lines and illustrated in the embodiment of FIG. 3. In this instance, the controller circuit is shown as including a microprocessor CPU 420 and an insert cue card 422 releasably connected within the microprocessor controller by connections 422a, 422b. The card or board 422 is a read only memory and is programmable to include the series of words corresponding to the groups of words used in memory device 230 of FIG. 3. A random access memory 424 is used with the CPU which includes a programmed read only memory to perform the steps previously described with respect to FIG. 3. Thus, the operation of controller 420 is controlled by the CPU and the difference between one film strip and the other is the read only memory 422. This contains the intelligence necessary for performing the desired functions between synchronizing pulses as previously described. As shown in FIG. 4, the programmable controller circuit 420 can control the eight bit latch 430 to sequentially provide block coded and instruction coded digital words. Also, a series of digital to analog converters 432 can be provided with a random access memory 426 which contains the up-to-date information regarding the gain of several speakers 412 located in the theater. Only one of the speakers and one of the converters are illustrated. The speaker is controlled by the voltage level controlled amplifier 408 through a power amplifier 410. In this manner, the separate speakers have a volume determined by the output of the converter circuits 432. The current volume level for each of the amplifiers 408 is stored in the random access memory 426 which is periodically updated by interrogation from the digital to analog converter circuit 432. The output 434 of circuit 432 controls the gain of amplifier 408. As can be seen, a programmable controller can be used with an insertable cue card for controlling the speakers and special effects devices in a theater in accordance with the concepts previously described in FIGS. 1-3. The showings in FIG. 4 are representative of this concept for practicing the invention.

Figure 5:
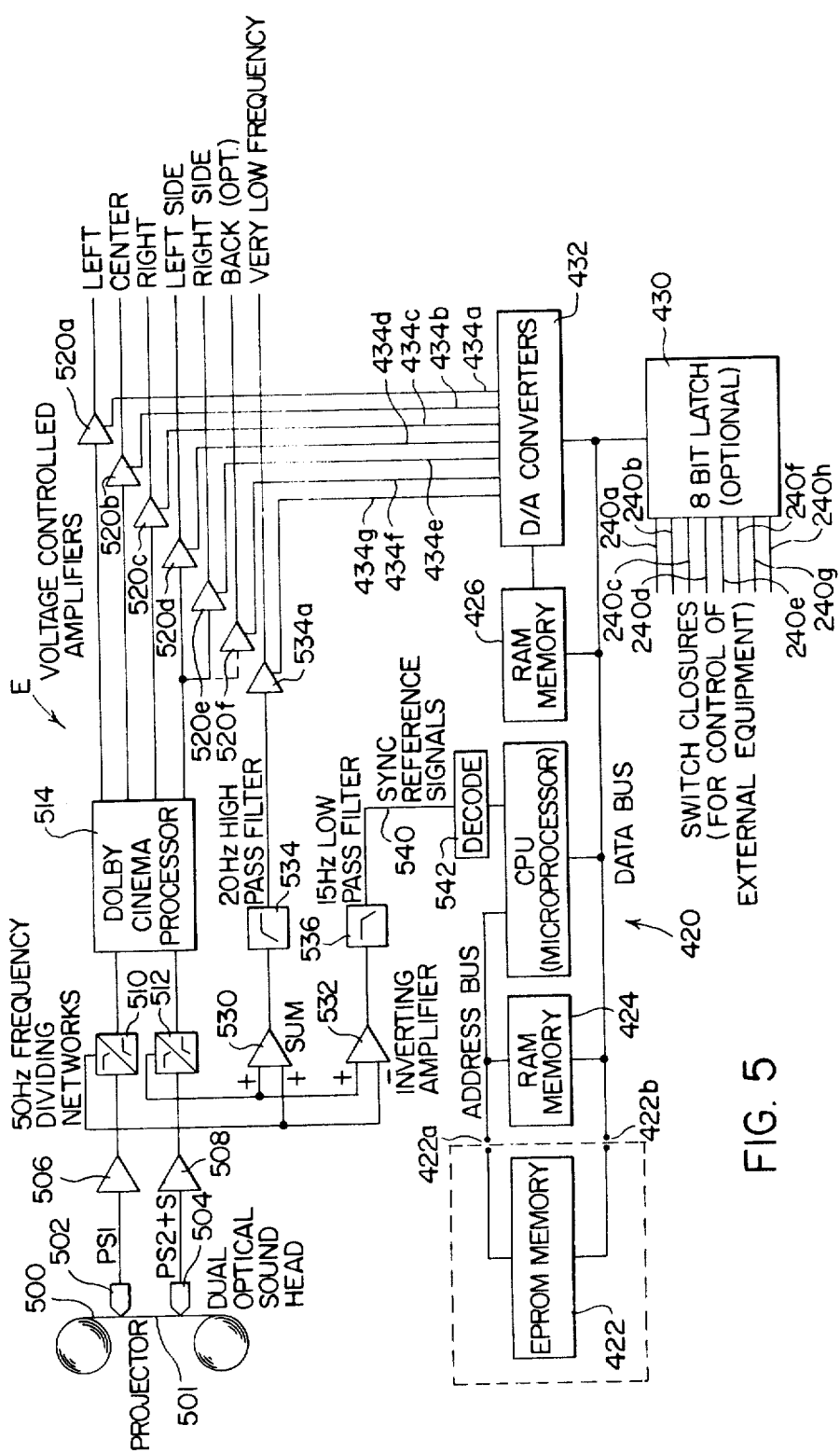

Referring now to FIG. 5, another system using a programmable controller of the microprocessor type such as controller 420 in FIG. 4, is illustrated as system E. In this system, the components bearing the numbers used in FIG. 4 are also used for the same functions. The particular system involves a projector 500 having two optical sound tracks containing separate program signals PS1, PS2. These optically recorded signals are sensed by pickup devices 502, 504 and amplified by amplifiers 506, 508, respectively. These two signals are then passed through frequency dividers 510, 512 from which all signals having a frequency below 50 hertz are divided out. The higher frequency signals are then passed to the standard Dolby cinema processor 514 for directing the program signals to separate gain controlled amplifiers 520a-e. An optional amplifier 520f is illustrated for use in the back of the theater. The labels at the output of the amplifier indicate the location of the speakers controlled by the separate amplifiers. These can be varied according to the desired blend and recording process used in creating the program cycles contained on the film strip 501. The gains of the various amplifiers are controlled by lines 434a-f. From the dividing networks 510, 512, the frequencies less than 50 hertz are directed to both a summing amplifier 530 and a differential amplifier 532. The output of the summing amplifier is passed through a high pass filter which allows transmission of frequencies of greater than 20 hertz. This controls a very low frequency speaker through a gain controllable amplifier 434. Of course, such low frequencies require a special speaker and amplifier arrangement which are well known in the art. The output of the differential amplifier is passed through a low pass filter 536 which filters out all frequencies above 15 hertz. Thus, the only frequencies appearing in line 540 is the synchronizing signal S with the background noise removed by amplifier 532. A decoder 542 converts the synchronizing signal to a digital signal for use in the microprocessor controller 420. This embodiment illustrates the use of optical sound tracks and a standard cinema processor for use in practicing the invention as previously described.

Figure 6:
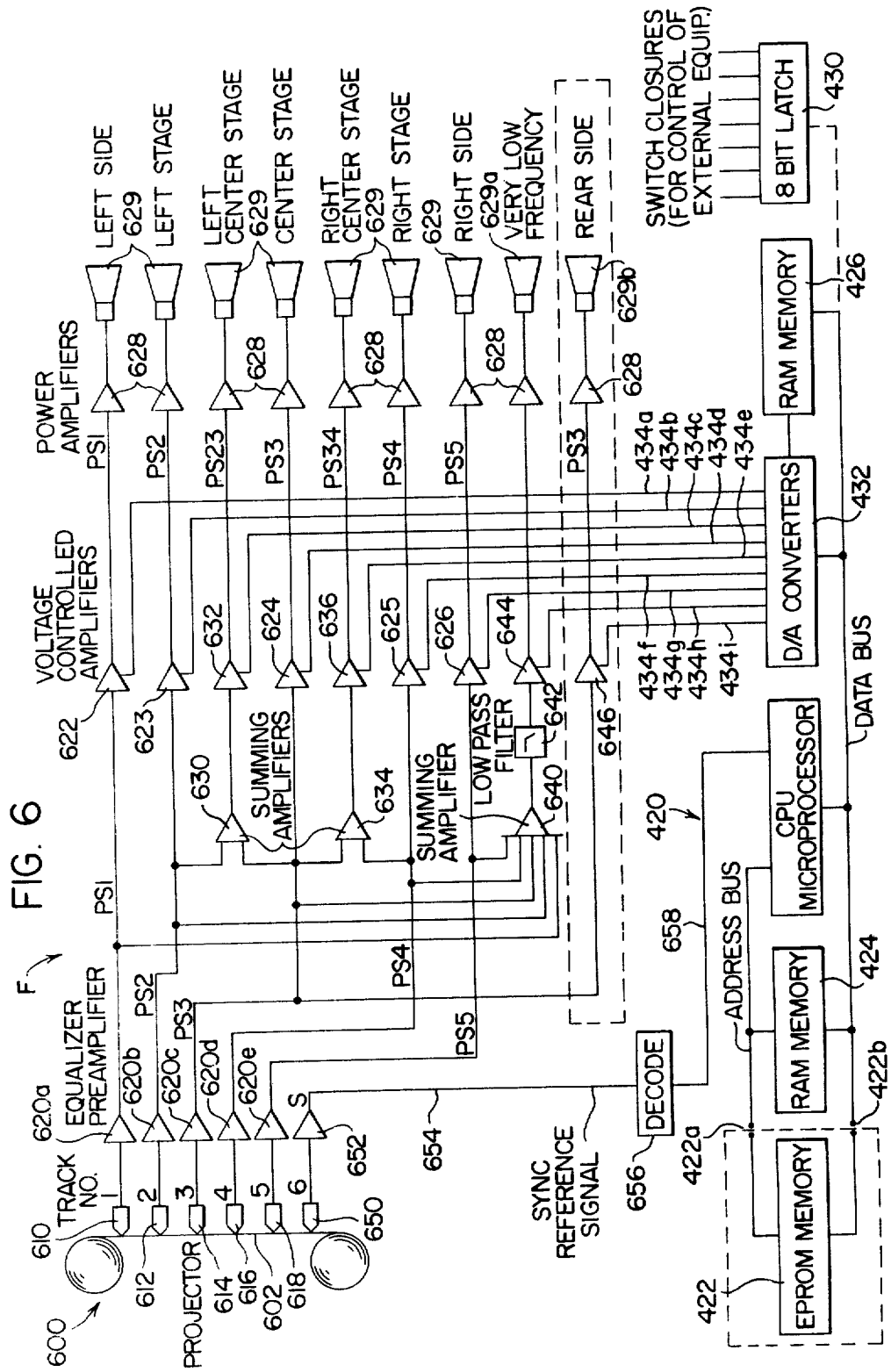

A further embodiment of the invention is illustrated in FIG. 6 wherein system F is similar to the system shown in FIG. 5 except that six magnetic tracks are employed. In this instance, five program signals PS1-5 are recorded on five separate tracks of film strip 602 passing through a somewhat standard projector 600. Pickup devices or sensors 610-618 sense the five program signals and direct them through power amplifiers 620a-e directly to gain control amplifiers 622-626, respectively. Consequently, the program signals drive corresponding power amplifier 628 and speaker 629 in accordance with the separate program signals PS1-PS5. By using gain control amplifiers, even separate program signals can be better controlled because of the relatively low head room in magnetic sound tracks compared to the wide range of volume desired in proper blending in a theater. Thus, the volume control of amplifiers 622-626 by lines from converter 432 provide a wider range of sound variations at speakers 629. A summing amplifier 620 adds the program signals PS2 and PS3 and applies this summation to a gain controlled amplifier 632 for driving the left center stage speaker 629. In a like manner, summing amplifier 634 drives gain control amplifier 636 to provide a combined PS3 and PS4 signal to the right center stage speaker. This allows for control of the sound on each side of the theater in accordance with the dual program signal having independently controlled volume and determined by the output analog voltages from converters 632. To provide low frequency sound in a special low frequency speaker 629a, there is provided a summing amplifier 640 for summing all five program signals. This summation is passed through a low pass filter 642 to gain controlled amplifier 644. Thus, the low frequency from all program signals is channeled to a preselected low frequency speaker 629a for producing infrasound sensations in the theater. As can be seen, optional gain control amplifier 646 can direct the PS3 program signal to the rear speaker 629b. This provides volume control of the PS3 signal at front center stage and rear side for blending between these two portions of the theater. The gain controlled amplifiers for the various speakers are controlled by analog signal on lines 434a-434f from digital to analog converters 432 in accordance with the previously described principles. To create the time interval synchronizing signal for the controller 420, there is provided a separate track on film strip 602. The coded signal on this track is sensed by sensor 650 and passed through a power amplifier 652 to an output line 654. Decoder 656 decodes this signal into a usable digital signal in line 658.

Having thus described the invention, it is claimed:

1. A method of controlling a plurality of distinct devices in a theater displaying a projected motion picture contained on a moving film strip in synchronization with said film strip, said method comprising the steps of:
   (a) providing on said film strip a series of synchronizing signals evenly spaced along said film to define a time interval between said synchronizing signals when said film is moving at a selected rate with each of said synchronizing signals on said film strip including a distinct time interval identifying code;
   (b) reading said synchronizing signals as they appear at or near the projected portion of said film strip to determine the current time interval of said moving film strip;
   (c) selecting a group of preselected memory stored digital control signals in response to said determined current time interval, said memory stored signals each including a select code identifying one of a plurality of output blocks, each block controlling one or more of said devices, and an instruction code identifying the control function said output block is to perform on said device or devices;
   (d) cycling said memory stored digital control signals of said selected group in a preselected sequence over a period of time generally corresponding to said time interval and determined by the number of stored digital control signals in said selected group to direct said digital signals to said output blocks; and
   (e) causing said code selected output block of each digital control signal to perform said control function of said instruction code of said digital signal.

2. The method as defined in claim 1 including the additional step of:
   (f) latching said control function in at least some of said output blocks until a successive select code of a digital control signal again selects said latched output block.

3. The method as defined in claim 1 wherein a specific device connected to one of said output blocks has on and off states and including the additional steps of:
   (f) switching said specific device to said on state in response to a given instruction code during selection of said one of said output blocks; and,
   (g) turning said specific device off in response to a given instruction code during selection by a select code corresponding to said one of said output blocks.

4. The method as defined in claim 3 including the additional step of:
   (f) shifting said specific device from the on state to the off state after a preselected time if said specific device remains in the on state for said preselected time.

5. The method as defined in claim 1 wherein a specific device connected to one of said output blocks has a condition responsive to an electrical analog signal and including the steps of:
   (f) creating a digital output signal in response to said instruction code to said one of said output blocks during selection of said one of said output blocks by a select code corresponding to said one of said output blocks;
   (g) converting said digital output signal to an electrical analog output signal; and,
   (h) controlling said specific device by said analog output signal.

6. In a system for controlling a plurality of distinct devices in a theater displaying a projected motion picture contained on a moving film strip in synchronization with said film strip, the improvement comprising: a memory unit for storing groups of digital control signals for operating said distinct devices in a selected manner during a selected time interval; means readable from said moving film strip for selecting one of said groups of digital control signals for a selected current time interval readable from said moving film strip; and means independent of said film strip for causing said stored digital control signals of a selected group to be outputted in a sequence corresponding to said time interval.

7. In a motion picture film strip having a sound track upon which there is recorded a program signal for driving theater speaker amplifiers, the improvement comprising: a machine readable digital signal recorded along a separate track, said digital signal uniquely identifying a segment of said film strip and a location in an associated memory.

8. Method of blending the effective audio sensation in a sound arena having a plurality of audio speakers at selected locations and driven by a single program signal recorded on a sound recording strip as said strip is being played; said method comprising the steps of:
   a. driving each of said speakers with said program signal through an amplifier having a gain controlled by an analog electrical signal whereby the level of said analog signal determines the volume of said program signal at said speaker;
   b. selecting a digital gain control signal for each of said speakers in response to a control signal recorded periodically on said strip, said digital gain control signals being stored in a memory unit;
   c. directing said digital gain control signals from said memory unit in response to a signal recorded on said strip;
   d. converting each of said digital gain control signals to an analog electrical signal corresponding to said desired volume at a given time; and
   e. controlling the driving amplifiers of each speaker in accordance with the level of one of said converted analog signals.

9. In a system for controlling a plurality of distinct devices in a theater displaying a projected motion picture contained on a moving film strip and in synchronization with said film strip, the improvement comprising: a memory unit for storing groups of digital control signals for operating said distinct devices in a selected manner during a selected portion of said moving film; means for selecting one of said groups of digital control signals for a selected portion of said moving strip; and means independent of said film strip for causing said stored digital control signals of the selected group to be outputted in a time sequence corresponding to said selected portion of said film strip.

10. In a motion picture film strip having a sound track upon which there is recorded a program signal for driving theater speakers, the improvement comprising: a series of machine readable reoccurring signals recorded at spaced intervals along said film strip, said signals each being individually coded for identifying a specific segment of said film strip and a corresponding location in an associated memory.

11. In a system for controlling a plurality of distinct devices in a theater displaying a projected picture formed from a series of picture frames projected in succession and in synchronization with said picture frames, the improvement comprising: a memory unit for storing groups of digital control signals for operating said distinct devices in a selected manner during selected picture frames; a strip moving in synchronization with progression of said picture frames, said strip containing a continuous program sound track; means for selecting one of said groups of digital control signals for a selected portion of said moving strip; and means independent of said moving strip for causing said stored digital control signals of the selected group to be outputted in a time sequence corresponding to said selected portion of said moving strip and said sound track thereon.

* * * * *